United States Patent [19]
End, III et al.

[11] Patent Number: 5,574,730
[45] Date of Patent: Nov. 12, 1996

[54] BUSSED TEST ACCESS PORT INTERFACE AND METHOD FOR TESTING AND CONTROLLING SYSTEM LOGIC BOARDS

[75] Inventors: Joseph H. End, III, Malvern; Todd M. Rimmer, Exton; Andrew F. Sanderson, Havertown, all of Pa.

[73] Assignee: Unisys Corporation, Blue Bell, Pa.

[21] Appl. No.: 381,046

[22] Filed: Jan. 31, 1995

[51] Int. Cl.$^6$ .................................................. G01R 31/28
[52] U.S. Cl. ...................................... 371/22.1; 371/22.3
[58] Field of Search .................................. 371/22.3, 22.5, 371/22.6; 324/537, 73 R; 395/183.06, 183.07

[56] References Cited

U.S. PATENT DOCUMENTS

| | | |
|---|---|---|
| 4,860,290 | 8/1989 | Daniels et al. . |
| 5,029,166 | 7/1991 | Jarwala et al. . |
| 5,054,024 | 10/1991 | Whetsel . |
| 5,056,093 | 10/1991 | Whetsel . |
| 5,130,988 | 7/1992 | Wilcox et al. . |
| 5,132,635 | 7/1992 | Kennedy . |
| 5,157,781 | 10/1992 | Harwood et al. . |
| 5,173,904 | 12/1992 | Daniels et al. . |
| 5,198,759 | 3/1993 | Ohnesorge . |
| 5,225,772 | 7/1993 | Cheung et al. . |
| 5,228,045 | 7/1993 | Chiles . |
| 5,270,642 | 12/1993 | Parker . |
| 5,285,152 | 2/1994 | Hunter . |
| 5,325,368 | 6/1994 | James et al. . |
| 5,329,471 | 7/1994 | Swoboda et al. . |
| 5,331,274 | 7/1994 | Jarwala et al. . |

*Primary Examiner*—Vincent P. Canney
*Attorney, Agent, or Firm*—John B. Sowell; Mark T. Starr; John F. O'Rourke

[57] ABSTRACT

Apparatus and method that incorporate bussed test access port interface into a system control interface for testing and controlling system logic boards in a manner that is fully compliant with the IEEE 1149.1 standard, while conserving system controller card signals. The apparatus incorporates six signals per interface, which includes the five standard signals as defined by IEEE 1149.1 standard plus a maintenance enable (ME) signal. Four of the standard signals, TCK, TMS, TDI and TRST* are bussed among multiple system logic boards, while the ME signals and the TDO signals are connected in a point-to-point manner between the system controller card and system logic boards. Instruction and data on the TCK, TMS, TDI, and TRST* signals are simultaneously bussed to all system logic boards. These four signals are received by each system logic board through an interface enable circuit, controlled by the ME signal line. If the instructions or data are intended for a specific system logic board, its corresponding ME signal line will be enabled to permit the passage of these signals and the resulting TDO signal through the interface enable circuit. This arrangement permits the incorporation of a bussed TAP interface into a system control interface for testing and controlling system logic boards that comply fully with the IEEE 1149.1 standard, while conserving the system controller card backplane pins dedicated to TAP signals, to two pins per system logic board plus four pins for the bussed TAP interface.

14 Claims, 9 Drawing Sheets

BUSSED TEST ACCESS PORT INTERFACE AND METHOD FOR TESTING AND CONTROLLING SYSTEM LOGIC BOARDS

BACKGROUND OF THE INVENTION

1. Field of the Invention

The present invention relates generally to a system for testing and controlling computer system logic boards that contain integrated circuits that conform to conventional test access port and boundary-scan architecture standards. More specifically, the present invention relates to a system that incorporates a bus to facilitate the sharing of test access port signals, while conserving system control signal pins on the system controller card.

2. Related Art

Due to the increased complexity in evolving surface-mount interconnection technology, testing systems have also evolved to overcome the cost and limited capability of traditional testing apparatus such as the bed-of-nails fixture. The main goals of a testing system are the abilities to confirm the correct interconnection of components, the proper function of each component and the proper interaction of components in a product. To this end, the international Joint Test Action Group (JTAG) created the IEEE 1149.1 (1990) test access port and boundary-scan architecture standard, which is incorporated herein in its entirety by reference.

One implementation of this standard involves the incorporation of a test access port (TAP) that can provide access to the test support functions built into a component or a digital logic board. The TAP is composed, as minimum, of three input connections and one output connection as defined by the IEEE 1149.1 standard. The three input connections are defined as test clock input, test data input, and test mode select input, while the output connection is defined as test data output. In addition, an optional fourth input connection defined as test reset input (TRST*) is permitted by the standard for initialization of the TAP controller.

The test clock input connection (TCK) provides the clock for the test logic, so that the test data path between components can be utilized independently of component specific system clocks. In addition, the IEEE standard requires that all stored state devices retain their state when the TCK signal is held at 0. This requirement is provided so that when a test system pauses to fetch test data from memory, the test logic may resume its operation after the TCK signal is restarted.

The test data input connection (TDI) and test data output connection (TDO) provide the test data and instruction to and from the test logic respectively, while the test mode select input (TMS) provides the control of test operations.

In addition, to ensure that test patterns can be applied, a framework is needed that can be utilized to transfer test data to or from the boundaries of individual components so that they can be tested as if they were freestanding. IEEE 1149.1 compliant components incorporating the boundary-scan technique coupled with a TAP provide such a framework. The technique involves the incorporation of a shift-register stage adjacent to each pin of a component so that signals at the component boundaries can be controlled and monitored using conventional scan testing techniques. Detailed discussion of the boundary-scan technique can be found in the IEEE 1149.1 standard (1991)).

The IEEE 1149.1 standard was originally designed as a manufacturing test facility for the testing of a single circuit card. Hence, it was adopted into stand-alone card testers that were used in manufacturing sites. However, the nature of the TAP interface standard also lends itself to be used in system control environments as well. The ability to incorporate off-the-shelf IEEE compliant testing components into a system control environment for the purpose of initialization, configuration, testing, fault isolation and recovery in the field, is a very desirable goal for computer system designers.

However, the incorporation of the IEEE TAP interface into a system control environment poses special problems. One goal in such environments is to have one system controller card managing a number of system logic boards. Complying to the IEEE 1149.1 standard will require five signals per system logic board if the optional TRST* signal is also incorporated. In a typical system environment of one system controller card and 40 target system logic boards, this requirement translates to 200 pins on the system controller card for TAP signals alone. When other control signals are then incorporated onto the system controller card, it is burdened with a tremendous number of backplane pins. The rise in backplane pins also increases cost and complexity in fault isolation during system maintenance operations.

SUMMARY OF THE INVENTION

The present invention is an apparatus that incorporates a bussed test access port (TAP) interface into a system control interface for testing and controlling system logic boards in a manner that is fully compliant with the IEEE 1149.1 standard, while conserving system controller card signals.

The present invention incorporates six signal connections per TAP interface, having five standard signal connections as defined by IEEE 1149.1 standard and an additional maintenance enable (ME) signal connection. Unlike the IEEE 1149.1 standard, four of the standard signal connections, TCK, TMS, TDI and TRST* are bussed among multiple system logic boards, while the ME signal connections and the TDO signal connections are implemented in a point-to-point manner between the system controller card and system logic boards.

It should be noted that the IEEE 1149.1 standard describes a TAP having four input signal connections (TCK, TMS, TDI and TRST*) and one output signal connection (TDO). These signal connections correlate to the definitions for component pins. In order to conform to the definitions of the IEEE 1149.1 standard, the interconnecting signals as used in the present invention between system controller card and system logic board, are labelled TC_TCK, TC_TMS, TC_TXD, TC_TRST* and TC_RXD(n) respectively. Similarly, the interconnecting signals for the ME signal connections are labelled TC_ME(n). The labelling of the interface and interconnecting signals is further discussed below.

In a preferred embodiment of the present invention, the apparatus controls the manner in which initialization instructions or test patterns are forwarded to the system logic boards. Instruction and data on the TC_TCK, TC_TMS, TC_TXD, and TC_TRST* signals are simultaneously bussed to all system logic boards. These four signals are received by each system logic board through an interface enable circuit, which is controlled by its unique TC_ME(n) signal line. The interface enable circuit located on each system logic board serves as a selector. If the instructions or data are intended for a specific system logic board, its corresponding TC_ME(n) signal line is enabled to permit the passage of these signals through the interface enable circuit. Similarly, system logic boards not intended to act upon these signals have their TC_ME(n) signal lines disabled, so that the TC_TCK, TC_TMS, TC_TXD, and TC_TRST* signals are ignored by these system logic boards.

The TC_RXD(n) signal which carries the result of the test is similarly managed. The TC_RXD(n) signal which is sourced by the system logic board must also pass through the same interface enable circuit that regulates the TC_TCK, TC_TMS, TC_TXD and TC_TRST* signals. Only an enabled system logic board is allowed to pass the TC_RXD(n) signal through its interface enable circuit, which is controlled by the TC_ME(n) signal line.

As an added assurance, all TC_RXD(n) signals are received on the system controller card through a TDI multiplexer, which is also controlled by the TC_ME(n) signal line. Hence, when the system controller card sources data and instructions to a specific system logic board, the system controller card effectively enables the interface enable circuit for the passage of signals to and from that system logic board and at the same time, enables its own TDI multiplexer to select the anticipated TC_RXD(n) signal from that system logic board. The addition of the TDI multiplexer prevents the system controller card from receiving unexpected TC_RXD(n) signals from possibly faulty system logic boards.

The resulting benefit in the saving of system control signal connections over conventional systems is significant. In a system with 40 system logic boards, the system controller card will allocate two pins for each system logic board for the dedicated TDO and ME signal connections and four pins for the bussed TCK, TMS, TDI and TRST* signal connections. This translates to 84 pins on the system controller card for TAP signal connections, which is a saving of 116 pins from the conventional application of the IEEE 1149.1 standard which requires 200 pins.

Thus, the present invention incorporates a bussed TAP interface to implement a system control interface for testing and controlling system logic boards that complies fully with the IEEE 1149.1 standard, while conserving system controller card signals.

DETAILED DESCRIPTION OF THE INVENTION

Figure 1:
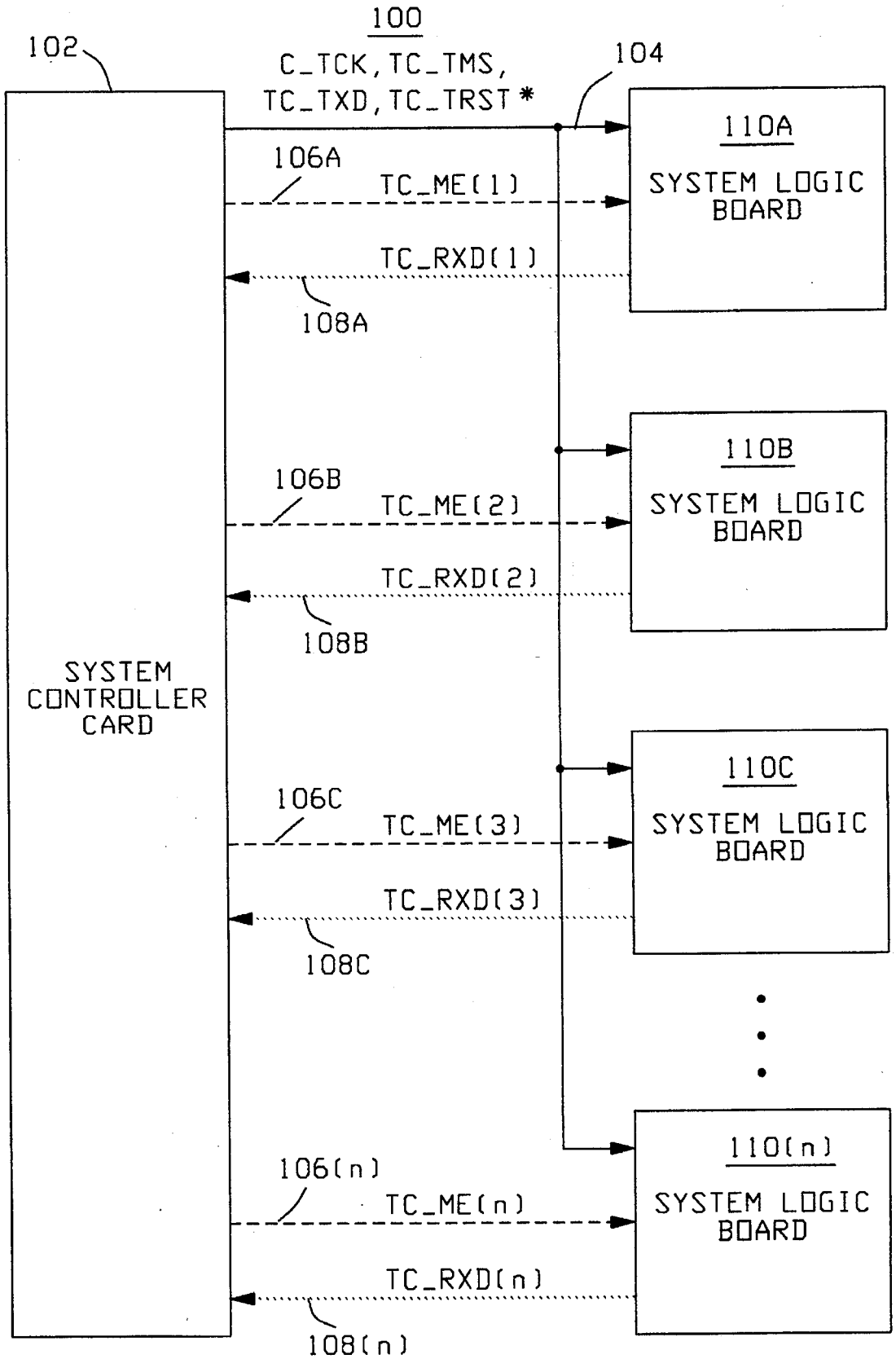
FIG. 1 is a block diagram of the apparatus using a bussed TAP interface for testing and controlling system logic boards of the present invention.

FIG. 1 illustrates an apparatus 100 using a bussed TAP interface for testing and controlling a number of system logic boards 110A–110(n) in accordance with the present invention. The apparatus includes a system controller 102, a TAP control bus 104, two point to point signal interconnections 106A–106(n) and 108A–108(n) per system logic board and a number of system logic boards 110A–110(n). These system logic boards 110A–110(n) can be implemented as system modules and need not be limited to logic boards. The system controller card 102 contains the necessary subsystem hardware and software to test and control system logic boards 110A–1110(n) through their TAP interfaces.

It should be noted that the IEEE 1149.1 standard was developed to provide standardization to the testing and monitoring of integrated circuits. The circuitry as defined by the IEEE standard permits test instructions and data to be inputted into a component and, subsequently, permits the results to be read out. The IEEE 1149.1 signals: TCK, TMS, TDI, TDO and TRST* represent signal definitions at the pins of an IEEE 1149.1 compliant component. Hence, where these signal names are used for interfaces other than components, these signal names represent signals which connect to a device pin with the same name. In order to be consistent with the IEEE 1149.1 definitions of test signal connections, the discussion of these test signals at the system logic board level in the present invention shall be in accordance with Table 1 below.

TABLE 1

| IEEE 1149.1 TAP INTERFACE PINS A) | | TAP CONTROL BUS INTERFACE (TARGET SYSTEM LOGIC BOARD) B) | | TAP CONTROL BUS INTERFACE (SYSTEM CONTROLLER CARD) C) | | TAP CONTROL BUS INTERCONNECTING SIGNALS D) |
|---|---|---|---|---|---|---|
| SIGNAL NAME | I/O | SIGNAL NAME | I/O | SIGNAL NAME | I/O | SIGNAL NAME |
| TCK | I | TCK | I | TCK | O | TC_TCK |
| TMS | I | TMS | I | TMS | O | TC_TMS |

TABLE 1-continued

| IEEE 1149.1 TAP INTERFACE PINS A) | | TAP CONTROL BUS INTERFACE (TARGET SYSTEM LOGIC BOARD) B) | | TAP CONTROL BUS INTERFACE (SYSTEM CONTROLLER CARD) C) | | TAP CONTROL BUS INTERCONNECTING SIGNALS D) |
|---|---|---|---|---|---|---|
| SIGNAL NAME | I/O | SIGNAL NAME | I/O | SIGNAL NAME | I/O | SIGNAL NAME |
| TDI | I | TDI | I | TDO | O | TC_TXD |
| TDO | O | TDO | O | TDI (n) | I | TC_RXD (n) |
| TRST* | I | TRST* | I | TRST* | O | TC_TRST* |
| n.a. | n.a. | ME | I | ME (n) | O | TC_ME (n) |

Table 1 shows the correspondence between signals defined for three different interfaces. Column A shows the TAP interface pins as defined by the IEEE standard, while Column B and Column C show the corresponding signals as defined by this invention for the interfaces on the system logic boards 110A–110(n) and system controller card 102 respectively. Column D shows the TAP control interconnecting signals as defined by this invention. Hence, a given row in the table indicates signals and interface pins which would be interconnected on the TAP control bus, which is further discussed below. To illustrate, the TDO interface pin on system controller card 102 is connected to the TDI interface pin on the system logic board 110(n), while the interconnecting signal that traverses the interconnection is labelled TC_TXD.

In addition, each column also displays the Input/Output senses for the test signals of each interface. It should be noted that the test signals on the system controller card interface have their I/O senses reversed from that of the system logic boards 110A–110(n). Hence, in accordance with the IEEE 1149.1 standard, TDI is connected to TDO.

In a preferred embodiment of the present invention, the system logic boards 110A–110(n) are connected to system controller card 102 via a TAP control bus 104. The system controller card 102 exercises the TAP control bus 104 which carries the TAP control bus test clock signal (TC_TCK), TAP control bus test mode select signal (TC_TMS), TAP control bus transmit data signal (TC_TXD) and TAP control bus test logic reset signal (TC_TRST*) to all system logic boards 110A–110(n). The TAP control bus 104 is distributed between system logic boards 110A–110(n) and the set of test signals on this TAP control bus is simultaneously presented to all system logic boards 110A–110(n).

Each system logic board 110(n) is also connected to the system controller card 102 via two dedicated point-to-point signal lines: a TAP control bus receive data signal (TC_RXD(n)) 108A–108(n) and TAP control bus target board maintenance enable signal (TC_ME(n)) 106A–106(n). The TC_ME(n) signals 106A–106(n) are sourced by the system controller card 102 and are used to enable target system logic board 110(n) to communicate with the system controller card 102. The TC_RXD(n) signals 108A–108(n) on the other hand, are sourced by the system logic boards 110A–110(n) and are used to carry test data from the system logic boards 110A–110(n) to the system controller card 102.

Figure 2:
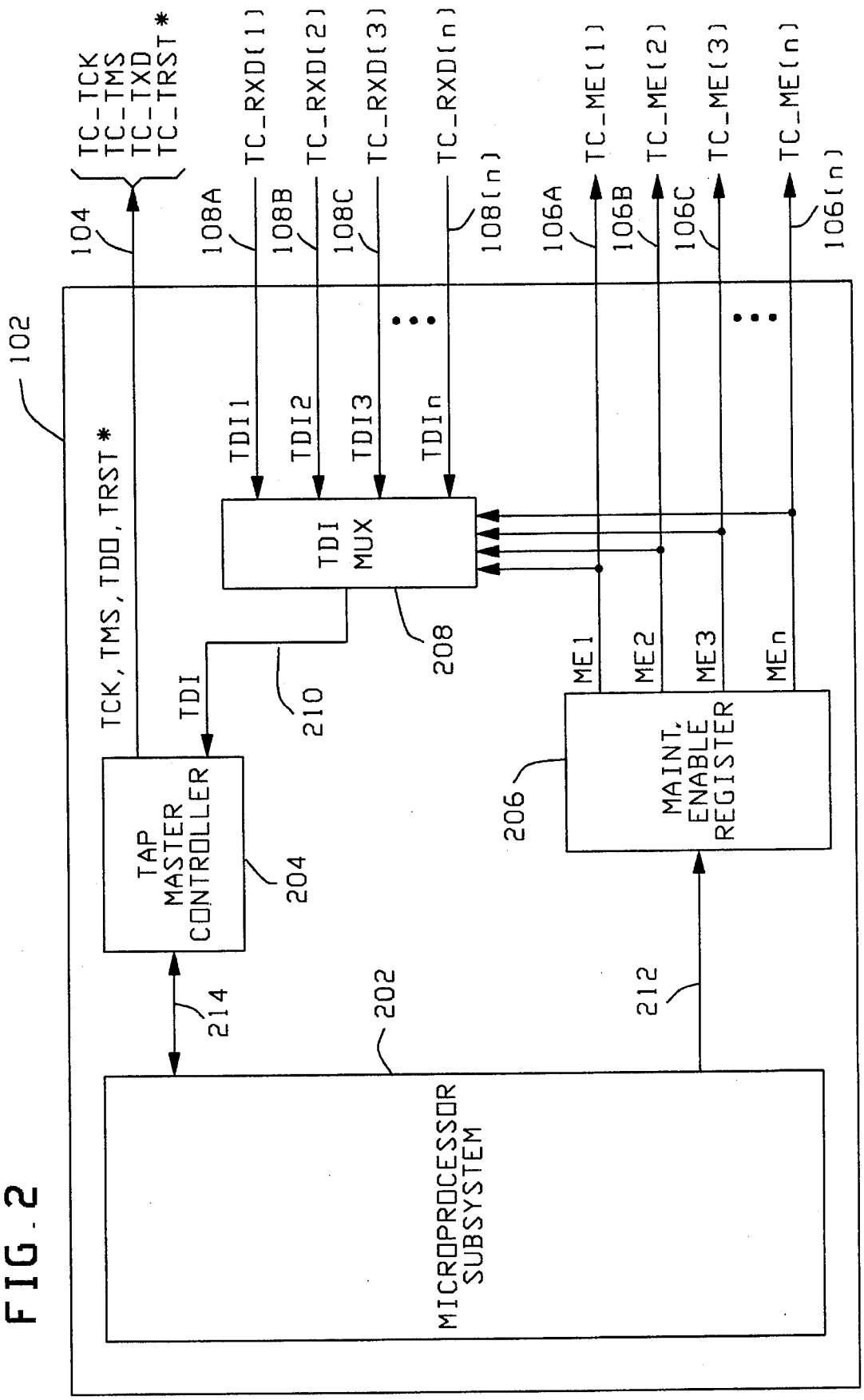
FIG. 2 is a block diagram of a system controller card in a preferred embodiment of the present invention.

FIG. 2 illustrates the TAP interface logic of the system controller card 102, which includes a microprocessor 202, a TAP master controller 204, a maintenance enable register 206 and a TDI multiplexer 208. The processor 202 with internal memory executes software that determines the specific TAP test sequences that should be used to exercise a target system logic board 110(n). The processor 202 communicates the test sequences to the TAP master controller 204 via interface 214. The TAP master controller 204 is a synchronous finite state machine in the preferred embodiment that implements the standard five signals of the IEEE 1149.1 TAP protocol. The TAP master controller 204 controls the TMS, TCK, TRST* and TDO signals and thereby controls the sequence of operations of the test logic as defined by the IEEE 1149.1 standard. The TAP master 204 is in turn connected to the TAP control bus 104 which passes these test signals to all system logic boards 110A–110(n).

The system controller card 102 also employs a maintenance enable register or latch 206 which receives values written from the processor 202 via data bus 212. The maintenance enable register 206 employs "n" number of bits which is a function of the "n" number of system logic boards 110A–110(n) in the system. Each bit correlates to a specific ME(n) signal connection. The values are presented as the TC_ME(n) signals 106A–106(n) to all system logic boards 110A–110(n). Each ME(n) signal connection receiving the value one ("1") causes its associated system logic board 110(n) to act upon the test signals presented on the TAP control bus 104. In contrast, each ME(n) signal connection receiving the value zero ("0") causes its associated system logic board 110(n) to ignore the test signals presented on the TAP control bus 104. Hence, a target system logic board 110(n) or a set of target system logic boards 110A–110(n) can be selected by the processor 202, through proper writing of values ("0" and "1") to the maintenance enable register 206.

The values on the ME(n) signal connections are also presented to the TDI multiplexer 208. The TDI multiplexer 208 has its inputs connected to the TC_RXD(n) signals 108A–108(n), while its output is connected to the TAP master controller 204 via TDI signal line 210. The selection as to which TC_RXD(n) signal 108(n) to pass to the TAP master controller 204 is controlled by the values on the ME(n) signal connections, which serve as the select to the TDI multiplexer 208. The TDI multiplexer 208 selects one of the TC_RXD(n) signals 108A–108(n) whose corresponding ME(n) signal connection is set at the value of one ("1").

However, during the operation of board initialization, it is possible that multiple system logic boards 110A–110(n) may be accessed at the same time. In this scenario, multiple TC_ME(n) signals are set to the value one ("1"). This in turn causes the TDI multiplexer 208 to select more than one TC_RXD(n) signal 108(n). Accordingly, the TAP master controller software is programmed to ignore the TDI signal 210 when multiple TC_ME(n) signals 106A–106(n) are set at the value of one ("1"). There is no consequence in ignoring the TDI signal because no return data are expected from the system logic boards 110A–110(n) during board initialization.

Thus, to summarize, processor 202 executes a test sequence which is sent to all system logic boards 110A–110(n) via the TAP master controller 204 and TAP control bus 104. Processor 202 selects a target system logic board 110(n) for testing by enabling its corresponding TC_ME(n) signal line 106(n). All other system logic boards 110A–110(n) will ignore the test signals on the TAP control bus 104 with the exception of the target system logic board 110(n). The enabled TC_ME(n) signal 106(n) also causes the TDI multiplexer 208 to select the corresponding TC_RXD(n) signal line 108(n) to receive the expected test data from the target system logic board 110(n).

Figure 3:
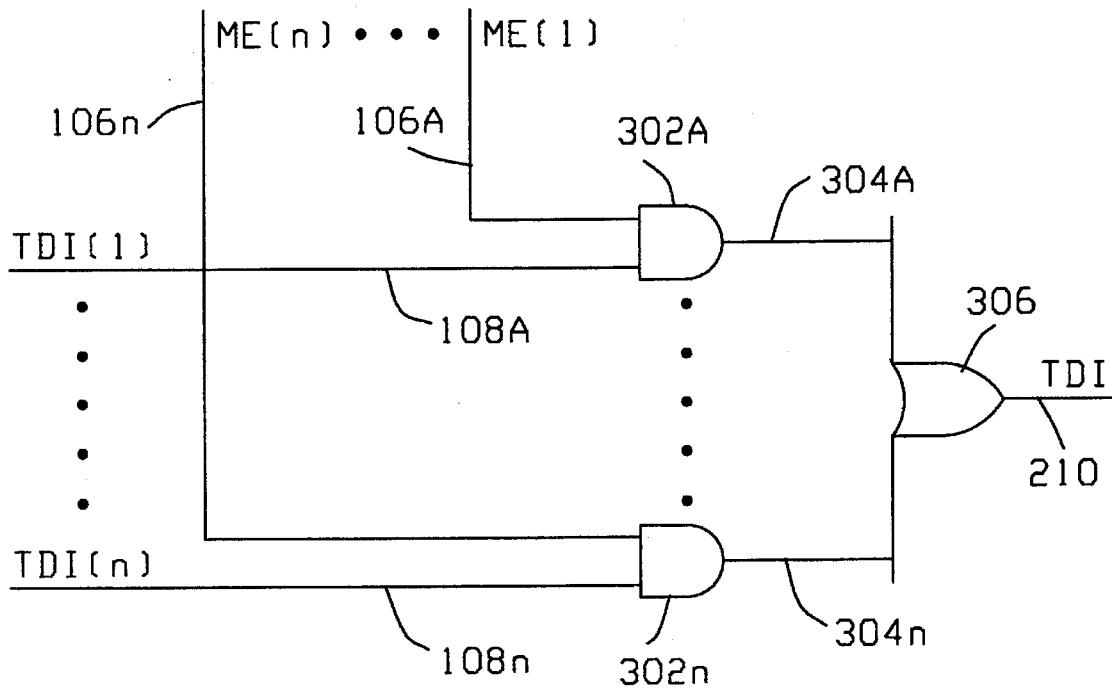
FIG. 3 is a logic diagram of a TDI multiplexer for managing TC_RXD(n) signals received from system logic boards in a preferred embodiment of the present invention.

FIG. 3 illustrates the cascaded AND and OR logic of the TDI multiplexer 208 which manages the TC_RXD(n) signals 108A–108(n) received from the system logic boards 110A–110(n) through interface pins TDI(1)–TDI(n). The TDI multiplexer 208 is composed of a number of 2-inputs AND gates 302A, . . . 302(n), whose outputs 304A, . . . 304(n) are fed into the OR gate 306. The inputs of each AND gate 302 are fed by a unique TC_RXD(n) signal 108(n) and its corresponding value on the ME(n) signal connection.

When a particular ME(n) signal connection is set at the value of one ("1"), it permits its corresponding TC_RXD(n) signal 108(n), when active, to pass data through AND gate 302(n) and OR gate 306 to reach TDI signal line 210. The data on TDI signal line 210 is then forwarded to the TAP master controller 204. As discussed above, during board initialization it is possible that multiple system logic boards 110A–110(n) are accessed. In this situation, multiple ME(n) signal connections are set to the value one ("1"), thereby enabling multiple AND gates 302A–302(n). This problem of having multiple TC_RXD(n) signals 108(n) reaching the TDI signal line 210 is resolved by programming the TAP master controller software to ignore the TDI signal line 210 when multiple ME(n) signal connections are set at the value of one ("1").

Figure 4:
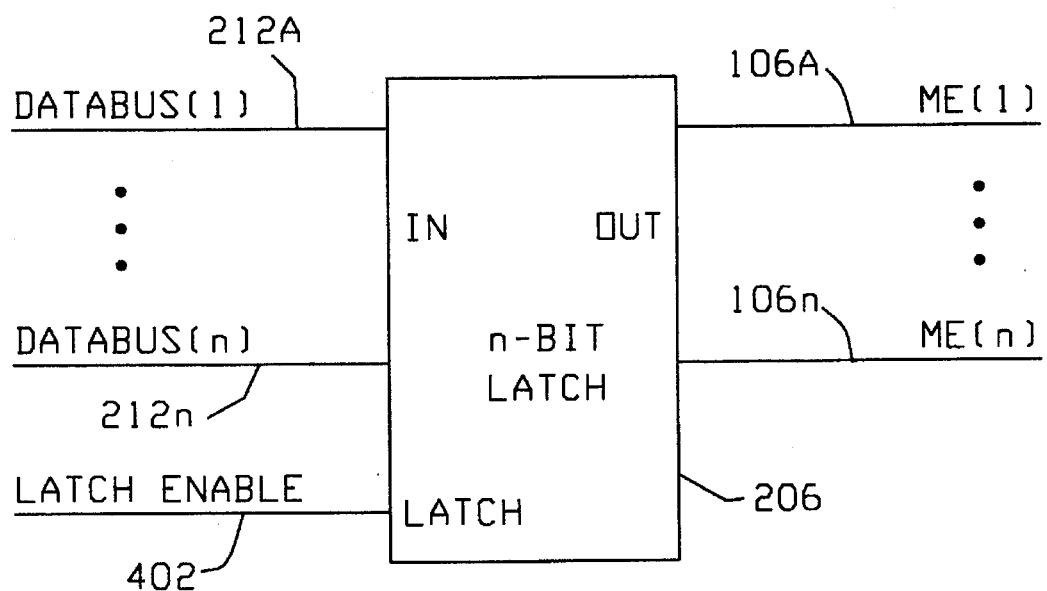
FIG. 4 is a block diagram of a maintenance enable register in a preferred embodiment of the present invention.

FIG. 4 illustrates a parallel maintenance enable register 206 in a preferred embodiment of the present invention. The number of bits employed by the maintenance enable register 206 is a function of the number of system logic boards 110A–110(n) in the system. There must at least be one bit for each TC_ME(n) signal line 106(n). The maintenance enable register 206 is utilized by processor 202 via data bus 212 to write the value which enables the corresponding TC_ME(n) signal line 106(n). The latch enable 402 is controlled by processor 202 for latching the value from data bus 212 into the maintenance enable register 206 and the TC_ME(n) signal lines 106A–106(n).

As shown in FIGS. 3 and 4, the number of system logic board 110(n) is not limited to four as illustrated in FIG. 1. Four system logic boards are illustrated for simplicity, while the apparatus can actually accommodate up to "n" number of system logic boards 110A–110(n).

Figure 5:
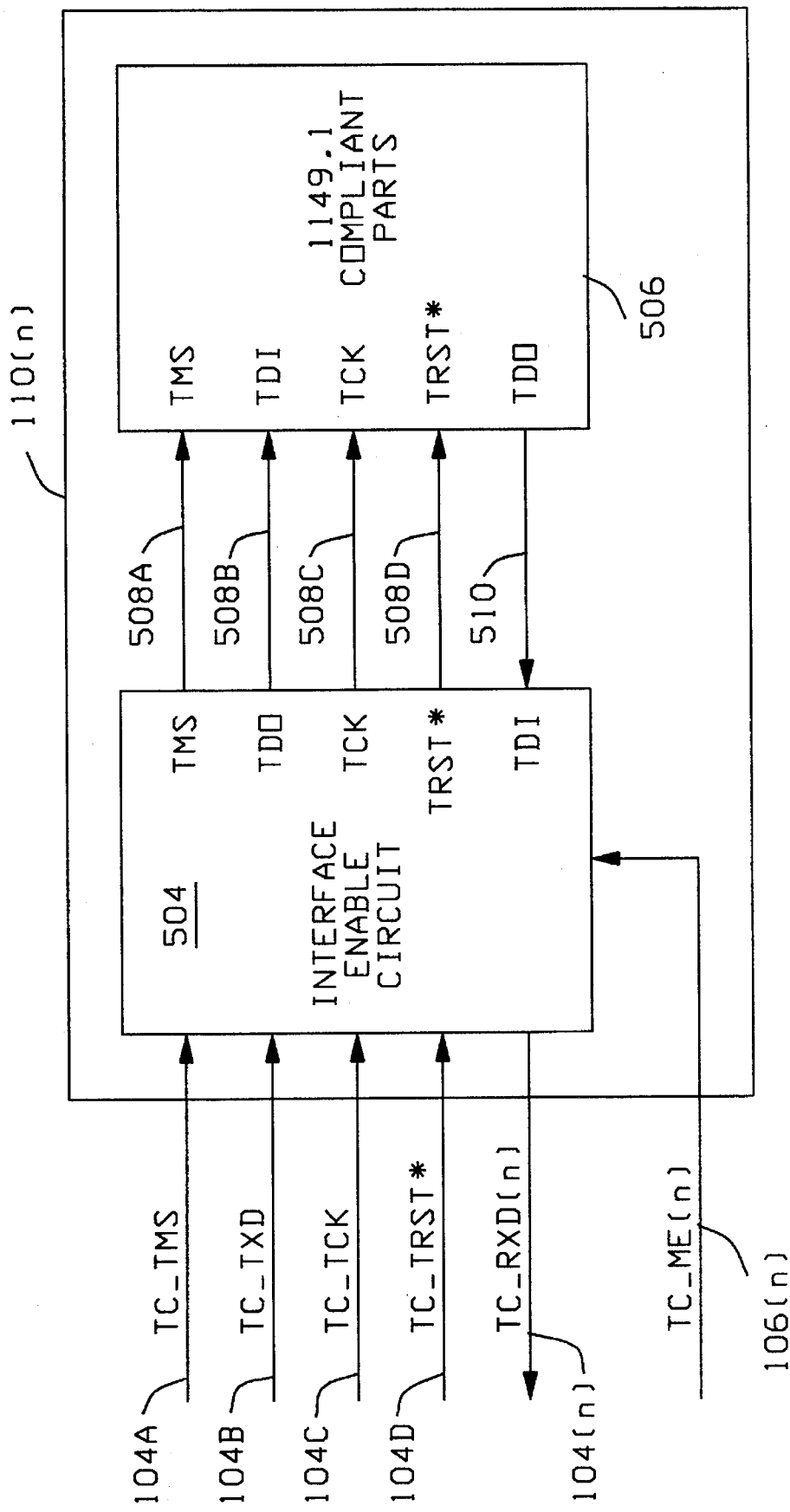
FIG. 5 is a block diagram of a system logic board in a preferred embodiment of the present invention.

Referring to FIG. 5, a system logic board 110(n) is shown with an interface enable circuit 504 and IEEE 1149.1 compliant parts 506. In a preferred embodiment of the present invention, a system logic board 110(n) contains a number of IEEE 1149.1 compliant parts 506 that are interconnected so as to form a shift-register chain. This path is provided with serial input and output connections to facilitate testing with the TAP control bus 104.

The interface enable circuit 504 receives input signals TC_TMS, TC_TXD, TC_TCK and TC_TRST* 104A–104D from TAP control bus 104, while signal 510 is received from IEEE 1149.1 components 506. The passage of these signals to and from the system logic board 110(n) is controlled by the TC_ME(n) signal 106(n). When the TC_ME(n) 106(n) signal line is enabled, the signals on the TAP control bus 104 are allowed to pass through the interface enable circuit 504 to reach the IEEE 1149.1 compliant parts 506 via signal lines 508A–508D. Similarly, signal 510 carrying test data from the IEEE compliant parts 506 is allowed to pass through the interface enable circuit 504 to reach the TAP master controller 204 via the TC_RXD(n) signal 108(n).

Alternatively, when the TC_ME(n) signal 106(n) is disabled, the interface enable circuit 504 blocks the signals on the TAP control bus 104 and passes the off/disabled signal values of the TMS, TDI, TCK and TRST* signals to the IEEE compliant components 506 instead. The off/disabled signal values of the TMS, TDI, TCK and TRST* signals are defined by the IEEE 1149.1 standard as 1, 1, 0 and 1 respectively. Similarly, the test data signal 510 from the IEEE component parts 506 is also blocked and the default signal value, established by pull-up resistor, is passed to the TAP master controller 204 via TC_RXD(n) line 108(n).

Figure 6:
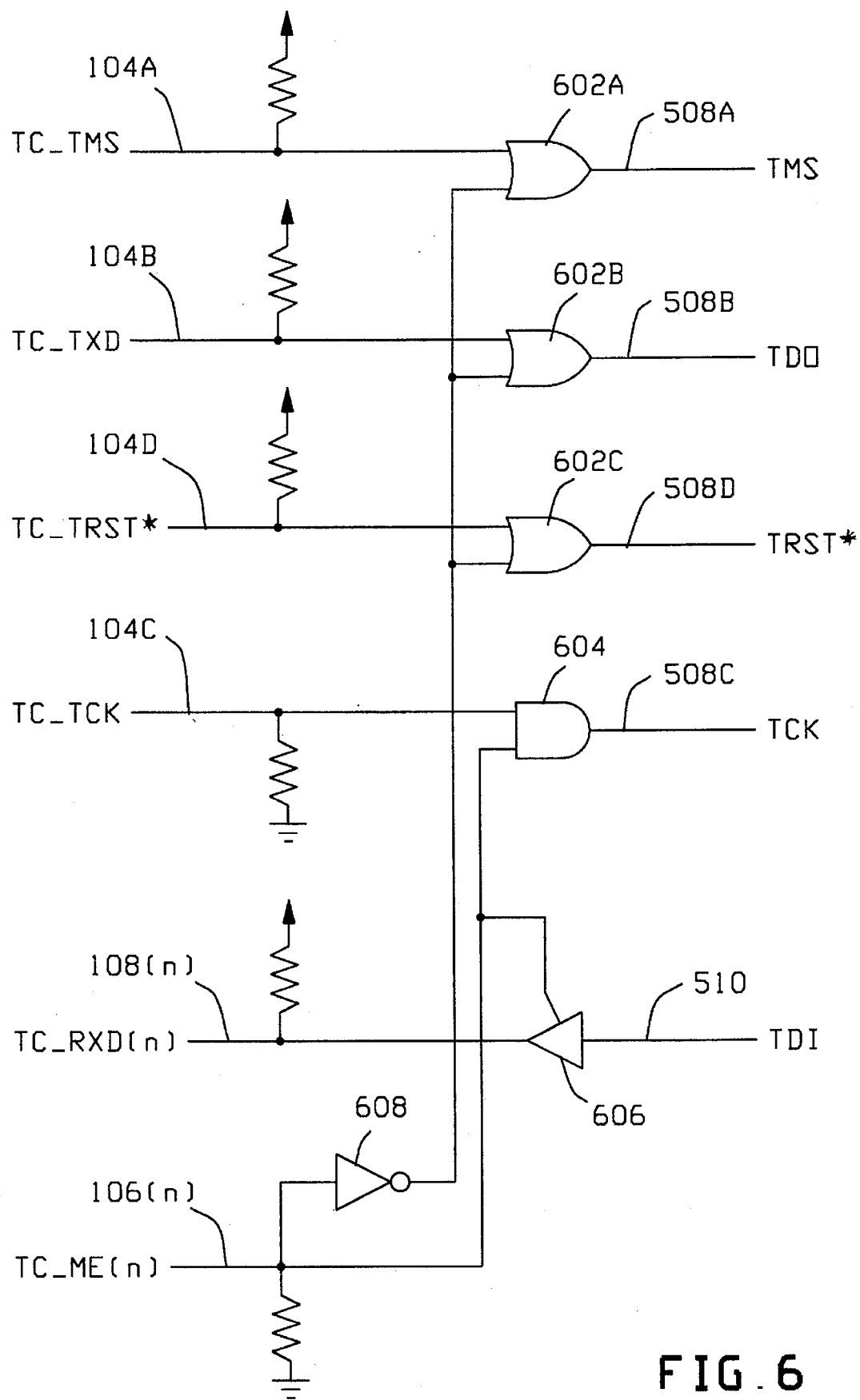
FIG. 6 is a combination logic circuitry diagram of a TAP interface with interface enable circuit in a preferred embodiment of the present invention.

Referring to FIG. 6, the TAP control bus 104 is shown with the interface enable circuit 504 which is controlled by the TC_ME(n) signal line 106(n). Each interface enable circuit 504 employs three 2-inputs OR gates 602A–602C and one 2-inputs AND gate 604. The inputs of each OR gate 602(n) are ted by an inverted TC_ME(n) signal 106(n) and one of three TAP control bus signals TC_TMS 104A, TC_TXD 104B or TC_TRST* 104D.

When the value on the TC_ME(n) signal line 106(n) is set at one ("1"), OR gate 602A receives the inverted TC_ME(n) value zero ("0") through inverter 608. This permits the TC_TMS signal 104A to pass through the OR gate 602A to reach the IEEE 1149.1 compliant components 506 via signal line 508A. Alternatively, when the value on the TC_ME(n) signal line 106(n) is set at zero ("0"), OR gate 602A receives the inverted TC_ME(n) value of one ("1"). This causes the OR gate 602A to block the TC_TMS signal 104A by continually passing the TMS off/disabled value of one ("1"). Since this mechanism is similarly applied to the TC_TXD signal 104B and TC_TRST* 104D as shown in FIG. 6, they are not discussed.

Since the off/disabled value for the TC_TCK signal 104C is zero ("0"), its handling is different from that of other test signals. When the value on the TC_ME(n) signal line 106(n) is set at one ("1"), AND gate 604 receives the TC_ME(n) value of one ("1") through one of its input. This permits the TC_TCK signal 104C to pass through the AND gate 604 to reach the IEEE 1149.1 compliant components 506 via signal line 508C. Alternatively, when the value on the TC_ME(n) signal line 106(n) is set at zero ("0"), AND gate 604 receives the TC_ME(n) value of zero ("0"). This in turn causes the AND gate 604 to block the TC_TCK signal 104C by continually passing the TCK off/disabled value of zero ("0").

The TC_ME(n) signal line 106(n) also controls the passage of the test data signal 510 from the IEEE 1149.1 components 506 to the TAP master controller 204 via signal line 108(n). The TC_ME(n) signal 106(n) controls a tri-state buffer 606 placed between signal line 510 and TC_RXD(n) signal line 108(n). With the value on the TC_ME(n) signal line 106(n) set at the value of one ("1"), the tri-state buffer 606 is enabled and signal 510 is passed from the system logic board 110(n) to the system controller card 102. Alternatively, when the value on the TC_ME(n) signal line 106(n) is set at zero ("0"), the tri-state buffer 606 is disabled and signal 510 is blocked and the default signal value, established by pull-up resistor, is passed to the TAP master controller 204 via TC_RXD(n) line 108(n).

Figure 7:
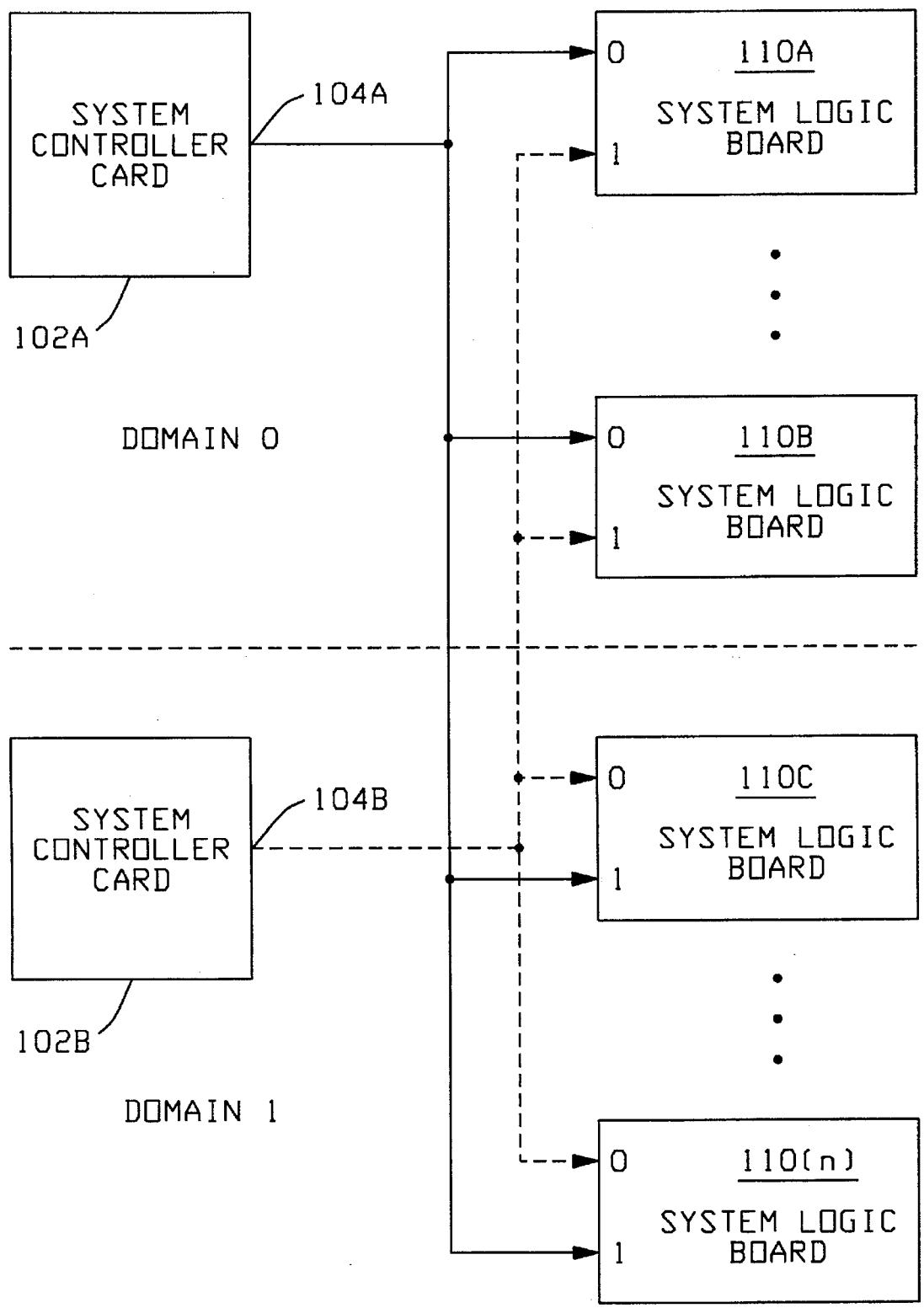
FIG. 7 is a block diagram of the apparatus using a redundant bussed TAP interface for testing and controlling system logic boards of the present invention.

In a second preferred embodiment of the present invention, a redundant TAP control bus topology is used to maintain a high degree of system resiliency for maintenance access. Referring to FIG. 7, the present invention comprises two system controller cards 102A–102B and two TAP control busses 104A–104B. System controller card 102A is the master of TAP control bus 104A, while system controller card 102B is the master of TAP control bus 104B. The TAP control busses 104A–104B are distributed between system logic boards 110A–110(n) and test signals on these TAP control busses are simultaneously presented to all system logic boards 110A–110(n).

The system logic boards 110A–110(n) are logically grouped into two separate domains of 0 and 1. The system logic boards 110A through 110B within domain 0 have their TAP control bus interface 0 connected to TAP control bus 104A, while their TAP control bus interface 1 are connected to TAP control bus 104B. In contrast, the system logic boards 110A through 110(n) within domain 1 have their TAP control bus interface 0 connected to TAP control bus 104B, while their TAP control bus interface 1 are connected to TAP control bus 104A. This particular arrangement provides maximum resiliency in the event of a failure of one of the system controller card 102, which is described further below.

Figure 8:
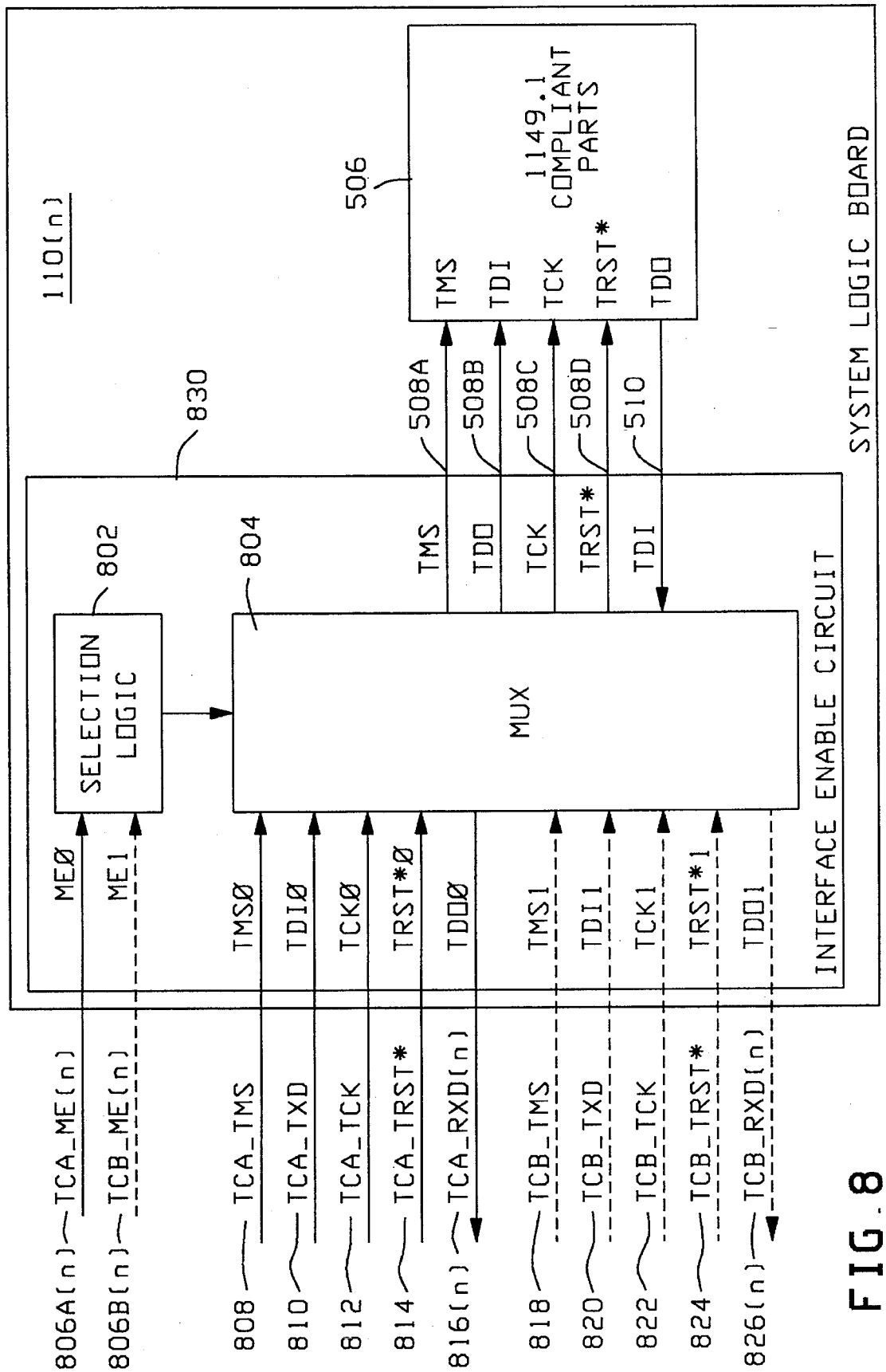
FIG. 8 is a block diagram of a system logic board with the multiplexer interface enable circuit for redundant bussed TAP interface in a preferred embodiment of the present invention.

Referring to FIG. 8, a system logic board 110(n) located in domain 0 is shown having an interface enable circuit and IEEE 1149.1 compliant parts 506. The interface enable circuit 830 contains multiplexer 804 and selection logic 802. The basic operation of this system logic board 110(n) is as discussed above with the exception of having an interface that communicates with two TAP control busses 104A and 104B. Signals prefixed with "TCA" 808–816(n) are either sourced or received by system controller card 102A, while signals prefixed with "TCB" 818–826(n) are either sourced or received by system controller card 102B. The test signals on both TAP control busses are both presented to system logic board 110(n), but the determination as to which TAP control bus controls the system logic board 110(n), is governed by selection logic 802 in accordance with Table 2 below.

TABLE 2

| ME1 | ME0 | OPERATION |
|---|---|---|
| 0 | 0 | Access disabled for system logic board |
| 0 | 1 | TAP control bus 104A controls system logic board |
| 1 | 0 | TAP control bus 104B controls system logic board |
| 1 | 1 | TAP control bus 104A controls system logic board |

The selection logic 802 uses the TCA_ME(n) 806A(n) and TCB_ME(n) 806B(n) signals to determine which TAP control bus is to control a given system logic board 110(n). The TCA_ME(n) signal 806A(n) and TCB_ME(n) signal 806B(n) are sourced by the system controller cards 102A and 102B respectively. When either the ME0 or the ME1 signal interface pin is not connected, its corresponding TCA_ME(n) 806A(n) or the TCB_ME(n) 806B(n) signals are pulled to the zero ("0") state. This situation occurs when a system controller card 102A or 102B is missing or faulty.

Referring to Table 2, when the values of zero ("0") are received by the selection logic 802 on both the ME1 and ME0 interface pins, access to the system logic board 110(n) is disabled. Similar to the first embodiment, when the TAP control bus access is disabled to a system logic board 110(n), the multiplexer 804 blocks the signals on both TAP control busses and the off/disabled signal values of the TMS, TDI, TCK and TRST* signals are passed to the IEEE compliant components 506 instead.

When the values of zero ("0") and one ("1") are received by the selection logic 802 on the ME1 and ME0 interface pins respectively, TAP control bus 104A controls system logic board 110(n). In contrast, when the values of one ("1") and zero ("0") are received by the selection logic 802 on the ME1 and ME0 interface pins respectively, TAP control bus 104B controls system logic board 110(n). However, the condition where both the ME1 and ME0 interface pins receive the values of one ("1"), also indicates a faulty system controller card and control of the system logic board 110(n) is given to the TAP control bus 104A.

The purpose behind the opposite connectivity for TAP control busses 104A and 104B with respect to TAP control bus interface 0 and 1 for system logic boards 110(n) that reside in different domains, is to provide maximum resiliency in the event of a failure of one of the system controller card 102. Should one system controller card 102 fail such that it drives some of its TC*_ME(n) signals high ("1"), at least one-half (½) of the system logic boards 110(n) can still be accessed by the other system controller card 102.

To illustrate, referring to FIG. 7 and FIG. 8, should system controller card 102A fail such that it drives all its TCA_ME(n) signals high ("1"), then system controller card 102A controls all system logic boards 110A–110B within domain 0 in accordance with Table 2. System controller card 102B which is not faulty, is nevertheless denied access to the system logic boards 110A–110B located in domain 0. However, since TAP control bus 104A is connected to the TAP control bus interface 1 for system logic boards 110C–110(n) located within domain 1, system controller card 102B can still gain access to these system logic boards 110C–110(n) in accordance with Table 2. This example is a worst case scenario.

Under a more favorable scenario, the faulty system controller card 102A may fail such that it drives all its TCA_ME(n) 806A(n) signals low ("0"), then system controller card 102B can still access all system logic boards 110A–110(n) within both domain 0 and 1 in accordance with Table 2. It should be noted that system logic boards 110A–110(n) should be distributed between domain 0 and domain 1 such that either domain represents a viable system, should one domain fail completely. This advantage is important to system designers who wish to provide high system availability. Hence, this second preferred embodiment of the present invention provides a redundant TAP control bus topology that maintains a high degree of system resiliency for maintenance access.

Figure 9:
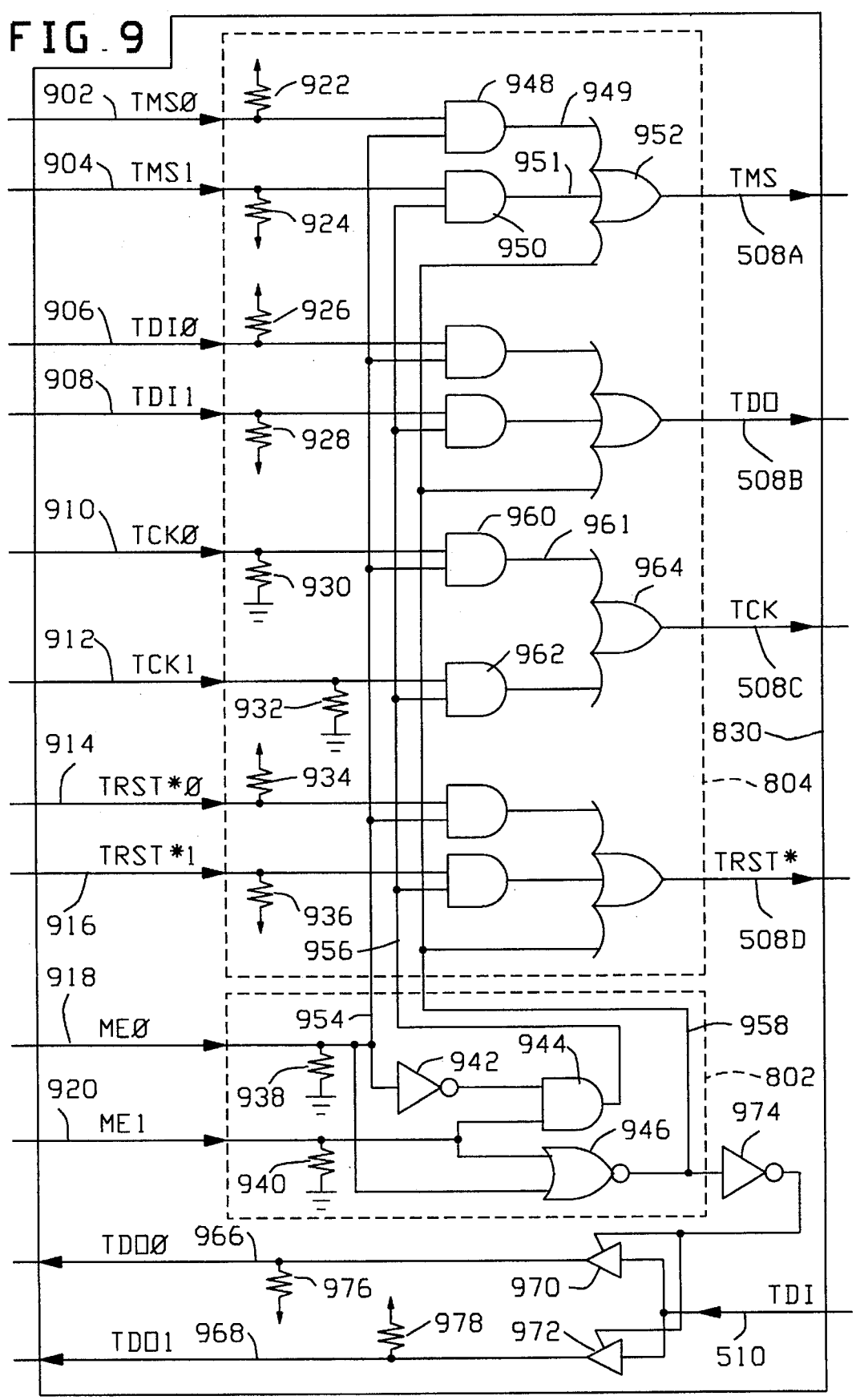
FIG. 9 is a detailed combination logic circuitry diagram of the multiplexer interface enable circuit in a preferred embodiment of the present invention.

FIG. 9 depicts details of the combination logic circuitry making up the interface enable circuit 830. As discussed above, the connectivity of the TAP control bus 104 and other signals to the interface pins on the interface enable circuit 830, depends upon the domain in which the system logic board 110(n) resides. For simplicity, the discussion on the operation of this combination logic circuitry is focused on the interface pins of the interface enable circuit 830 and is irrespective of the domain in which it resides.

The interface enable circuit 830 receives input signals from both TAP control busses 104A and 104B, while the signal 510 is received from IEEE 1149.1 components 506. These two TAP control busses 104A and 104B are connected to the interface pins 902–916. Pulling resistors 922–936 are connected to the TMS0, TMS1, TDI0, TDI1, TCK0, TCK1, TRST*0 and TRST*1 interface pins respectively, so that if the corresponding system controller card 102 is missing or faulty, the corresponding TAP control signals are pulled to their off/disabled state of one ("1") or ("0").

The passage of these signals to and from the system logic board 110(*n*) is controlled by the TCA_ME(n) and TCB_ME(n) signals 806A(n) and 806B(n). These signals enter the interface enable circuit 830 via the ME1 and ME0 interface pins 920 and 918, which go directly to selection logic 802. Pull down resistors 940 and 938 are also connected to the ME1 and ME0 interface pins respectively, so that if the corresponding system controller card 102 is missing or faulty, the corresponding TC*_ME(n) signal is pulled to the zero ("0") state.

When the ME0 and ME1 interface pins are enabled according to Table 2 above, the signals on the TAP control bus 104A or 104B are allowed to pass through the interface enable circuit 830 to reach the IEEE 1149.1 compliant parts 506 via signal lines 508A–508D. This is accomplished through the incorporation of an inverter 942, a two input AND gate 944 and a two input NOR gate 946 within the selection logic 802. In addition, a pair of two input AND gates and an OR gate is provided to each pair of TAP control bus signals.

To illustrate, the selection between the signals on the TMS0 and TMS1 interface pin 902 and 904 respectively is discussed. When the value on the ME0 interface pin 918 is set at one ("1") and the value on the ME1 interface pin 920 is set at zero ("0"), the ME0 signal 954 goes directly as an input to AND gate 948. This enables the output signal 949 of AND gate 948 to follow the signal on interface pin TMS0 902. In contrast, the output signal 956 of AND gate 944 has the value of zero ("0"), which is fed as an input to AND gate 950. This prevents the output signal 951 of AND gate 950 from following the signal on interface pin TMS1 904. In addition, the output signal 958 of NOR gate 946 has the value of zero ("0"), which is fed as an input to OR gate 952. This enables the output signal 508A of OR gate 952 to follow the signal on interface pin TMS0 902. Hence, the selection of the signal on the TMS0 interface pin 902 is realized.

In contrast, when the value on the ME0 interface pin 918 is set at zero ("0") and the value on the ME1 interface pin 920 is set at one ("1"), the reverse effect is achieved. The output signal 951 of AND gate 950 is enabled so that it follows the signal on interface pin TMS1 904, while the output signal 949 of AND gate 948 is prevented from following the signal on interface pin TMS0 902. Thus, the selection of the signal on the TMS1 interface pin 904 is realized. Since the selection logic for TDI0/TDI1 and TRST*0/TRST*1 is similarly applied, they are not discussed.

The selection logic for the TCK0 and TCK1 interface pins is very similar. The only difference is that output signal 958 is not fed into OR gate 964. Hence, if both signals on the ME0 and ME1 interface pins are set at the value zero ("0"), the output of OR gate 964 is at the value of zero ("0"), which is the off/disabled state for the TCK interface pin.

As discussed above, under the faulty condition where the values on both the ME0 and ME1 interface pins are set at one ("1"), the interface pins TRST*0, TMS0, TCK0 and TDI0 are enabled. The selection logic operates very much in the same manner as if the value on the ME0 interface pin 918 is set at one ("1") and the value on the ME1 interface pin 920 is set at zero ("0"). Output signals 954, 956 and 958 are set at the values ("1"), ("0") and ("0") respectively. This in turn causes the output signals 508A–508D to follow those signals connected to TAP control bus interface 0. This design coupled with the opposite connectivity for TAP control busses 104A and 104B with respect to TAP control bus interface 0 and 1, provides maximum resiliency in the event of a failure of one of the system controller card 102.

Finally, the generation of signals on the TDO0 and TDO1 interface pins 966 and 968 is discussed. The signal 510 is connected to both TDO0 and TDO1 interface pins 966 and 968 through output buffers 970 and 972, respectively. The control of these output buffers is governed by selection logic 802 in accordance with Table 2. When values on both the ME0 and ME1 interface pins are set at zero ("0"), the output of inverter 974 causes these output buffers 970 and 972 to be disabled. Signal 510 is blocked and the default signal values, established by pull-up resistors 976 and 978, are passed to both system controller card 104A–104B via the TCA_RXD(n) line 816(*n*) and the TCB_RXD(n) line 826(*n*) respectively.

Alternatively, when at least one of the ME0 or ME1 interface pins is set at the value of one ("1"), the output buffers 970 and 972 are enabled and the signal 510 is simultaneously passed to both system controller cards 102A–102B as the signals TCA_RXD(n) 816(*n*) and TCB_RXD(n) 826(*n*). It is the function of the TDI multiplexer 208 on each system controller card 102 to ignore these signals when its corresponding TC_ME(n) signal line is not set at the value of one ("1"). The buffers 970 and 972 serve to isolate faults on the TCA_RXD(n) signal 816(*n*) from effecting the operation of the TCB_RXD(n) signal 826(*n*) and the converse.

Figure 10:
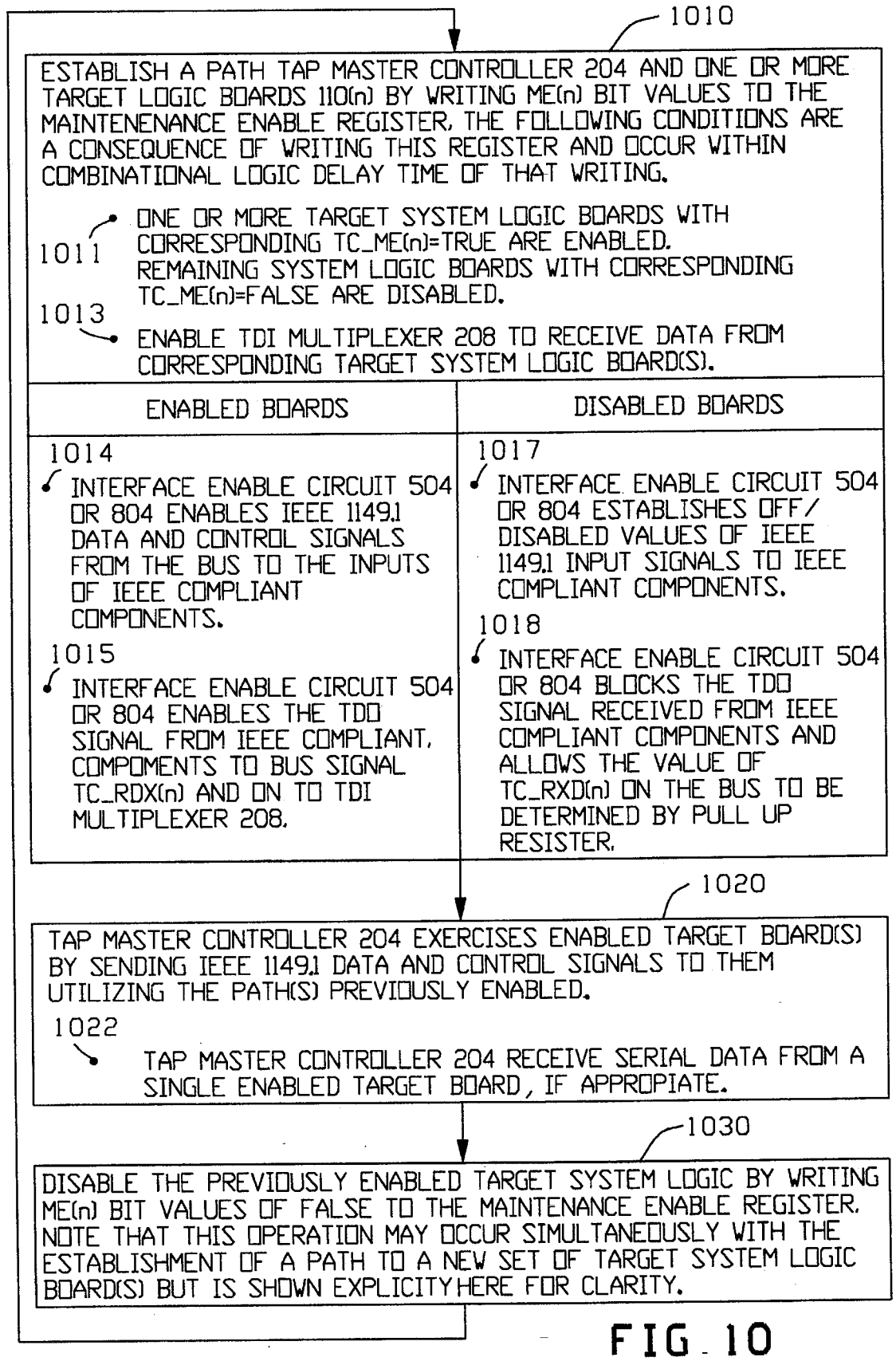
FIG. 10 is a flow chart illustrating the process 1000 for testing and controlling system logic boards with a bussed test access port interface, according to a preferred embodiment of the present invention.

FIG. 10 depicts the process 1000 for testing and controlling system logic boards with a bussed test access port interface, according to a preferred embodiment of the present invention. Once the system controller card 102 is in condition to exercise a system logic board 110(*n*), step 1010 is initiated. Referring to FIG. 2, step 1010 establishes a path between the TAP master controller 204 and one or more target system logic boards 110(*n*) by writing ME(n) bit values to the maintenance enable register 206. These ME(n) bit values are received by both the system logic boards 110(*n*) and the TDI multiplexer 208. Target system logic boards 110(*n*) receiving ME(n) bit values equal to TRUE ("1") through corresponding TC_ME(n) signal connections, are enabled in step 1011. Conversely, system logic boards 110(*n*) receiving ME(n) bit values equal to FALSE ("0") through corresponding TC_ME(n) signal connections, are disabled in step 1011. While in step 1013, TDI multiplexer 208 is enabled to receive data from corresponding target system logic boards 110(*n*) that have received the ME(n) bit value equal to TRUE ("1").

When a target system logic board 110(*n*) is enabled, two conditions are established as illustrated in step 1014 and step 1015. In step 1014, the interface enable circuit 504 or 804 is enabled so that IEEE 1149.1 data and control signals from the TAP control bus 104 are presented to the inputs of the IEEE compliant components 506, when step 1020 is initiated. Similarly, in step 1015, the interface enable circuit 504 or 804 is enabled, so that the TDO signal from the IEEE compliant components is passed to the TAP control bus signal TC_RXD(n), when step 1020 is initiated.

Conversely, when a system logic board 110(*n*) is disabled, two conditions are established as illustrated in step 1017 and step 1018. In step 1017, the interface enable circuit 504 or 804 is disabled so that the off/disabled values of the IEEE 1149.1 input signals are presented to the inputs of the IEEE compliant components 506, when step 1020 is initiated. While in step 1018, the interface enable circuit 504 or 804 is disabled, so that the TDO signal from the IEEE compliant components is blocked and the value on the TAP control bus signal TC_RXD(n) is established by pull-up resistor.

Once a path between the TAP master controller 204 and one or more target system logic boards 110(n) is established by writing ME(n) bit values to the maintenance enable register 206, step 1020 is initiated. In step 1020, TAP master controller 204 exercises the enabled target system logic boards 110(n) by sending IEEE 1149.1 data and control signals through the path(s) previously established in step 1010. These IEEE 1149.1 data and control signals are only passed to the IEEE components on an enabled target system logic board 110(n) as described in step 1014. Since an IEEE 1149.1 compliant component incorporates the technique of a shift-register stage, serial data are simultaneously shifted out of the IEEE compliant component as data is shifted into the component. Hence, in step 1022, TAP master controller is enabled to receive result data from a single enabled target system logic board 110(n), but is programmed to ignore result data when multiple target system logic boards 110(n) are enabled, as in the case of system logic board initiations.

Finally, in step 1030, the TAP master controller 204 may disable previously enabled target system logic boards by writing ME(n) bit values of FALSE ("0") to the maintenance enable register 206. However, this step of disabling target system logic boards may occur simultaneously with the enablement of a new set of target system logic boards 110(n), in which case steps 1010 through 1020 are repeated.

The advantages of the present invention are significant. First, the apparatus permits the continual operation and testing of various system logic boards even when some system logic boards are missing or faulty. Since instruction and data on the TC_TCK, TC_TMS, TC_TXD, and TC_TRST* signals 104A–104D are simultaneously bussed to all system logic boards 110A–110(n) in a parallel manner, a missing or faulty system logic board 110(n) can simply be disabled via its TC_ME(n) 106(n) signal line.

Second, the apparatus permits simultaneous output shifts to multiple system logic boards 110A–110(n) as in the case of board initialization. This unique feature takes advantage of the fact that there are operations where the receipt of return data from the system logic boards is not important.

Third, the apparatus permits temporary interruption of current test operation to accommodate the execution of another operation. In order to accomplish the temporary interruption and subsequent resumption of the current test operation, it is necessary to preserve all existing TAP controller and string state which exists on each of the "n" target system logic board 110(n). It is also necessary to preserve any string state which exists on the system controller card 102 for each of the "n" physical ports provided when is desired to disconnect from a given target system logic board 110(n) and to restore this string state when it is desired to reconnect to that same target system logic board 110(n).

TAP controller and string state on the target system logic boards 110A–110(n) are preserved by exercising TC_ME(n) 106(n) and TC_TCK 104C such that TC_ME(n) transitions from the TRUE ("1") to FALSE ("0") condition while TC_TCK is in a quiescent condition. This effectively gates off any subsequent TC_TCK pulses to target system logic board 110(n) while TC_ME (n) 106(n) remains FALSE ("0"), thus preserving the state of all TAP controllers and strings on the indicated target system logic board 110(n). A complementary transition of TC_ME(n) 106(n) from the FALSE ("0") to the TRUE ("1") condition while TC_TCK 104C is in a quiescent condition will enable activity to the target system logic board 110(n) to resume when desired. The preservation of string state within the system controller card 102 is a function of the software on that card. This is accomplished by saving the values of the internal register of the TAP master controller 204 into the memory of microprocessor 202 and restoring the TAP master 204 with the previously saved values for the board 110(n) now being accessed.

For example, if an operator wishes to initialize a board while a particular system logic board 110(n) is under test, the operator can simply pause the test by disabling the corresponding TC_ME(n) 106(n) signal line, which causes the TAP control bus to forward an off/disabled state to the system logic board 110(n). The system logic board 110(n) retains its states until the test is resumed after the initialization of the other system logic board 110(n). In this manner, the test may continue from the point where it was left off without loss of data.

Fourth, the apparatus permits system logic boards that have different TC_TCK clock frequency specifications to coexist within the system without requiring the system controller card 102, which sources the TC_TCK clock 104C, to operate the TAP control bus at the minimum of the maximum TC_TCK clock frequencies specified for each of the unique system logic board 110(n) type. In a preferred embodiment of the present invention, the system controller card 102 has a programmable frequency TC_TCK clock generator. Since each TAP interface on the system logic board is uniquely enabled by its own TC_ME (n) signal 106(n) from the system controller card 102, each TAP operation can execute at the maximum TC_TCK clock rate that the target system logic card 110(n) supports.

To illustrate, the TAP interface on a system logic board 110(A) having a lower TC_TCK clock frequency specification can be disabled during a TAP operation to another system logic board 110(B) that supports a higher maximum TC_TCK clock rate without adversely effecting system logic board 110(A). The TC_TCK clock frequency specification for a particular system logic board 110(n) can be stored and retrieved along with the test instructions and data for that particular system logic board 110(n). Hence, prior to the execution of a test pattern, the programmable TC_TCK clock generator can be set by the software to the speed at which TC_TCK for the target system logic board 110(n) should be driven. This overcomes the undesirable effect of a test system of interconnected IEEE 1149.1 compliant target system logic boards 110A–110(n), having its performance limited to the lowest TC_TCK clock speed of a particular system logic board 110(n) in the system.

Fifth, the apparatus is fully compliant to the IEEE 1149.1 protocol, so that it permits the use of IEEE 1149.1 compliant parts and TAP shift description software. This facilitates the use of off-the-shelf IEEE compliant components, thereby reducing cost of the overall system.

Finally, the apparatus permits the incorporation of a redundant TAP control bus topology, which is used to maintain a high degree of system resiliency for maintenance access. In this second preferred embodiment, the present invention comprises two system controller cards 102A–102B and two TAP control busses 104A–104B. This redundant TAP control bus topology and the implementation of opposite connectivity for TAP control busses 104A and 104B with respect to TAP control bus interface 0 and 1, provide maximum resiliency in the event of a failure of one of the system controller card 102.

Many modifications and variations of the present invention are now possible in light of the above teachings. It is therefore to be understood that the foregoing embodiments are presented by way of example only in that it is in the spirit of the claims attached hereto that the invention may be practiced other than as specifically described.

What is claimed:

1. A system for testing and controlling a plurality of system logic boards, each system logic board having at least one integrated circuit which is designed in accordance with conventional test access port and boundary-scan architecture standards, the system, comprising:

a controller for producing test access port signals and enable signals;

a bus coupled between said controller and the plurality of system logic boards for transferring contemporaneously said test access port signals from said controller to each of the plurality of system logic boards, wherein said test access port signals include a test data input signal (TC_TXD);

first signal lines coupled between said controller and the plurality of system logic boards, for transferring at least one active or non-active enable signal from said controller to at least one of the plurality of system logic boards, wherein said system logic boards are responsive to said test access port signals when said system logic boards receive active enable signals and cause said system logic boards to produce test results signals; and second signal lines coupled between said controller and the plurality of system logic boards, for transferring said test result signals to said controller.

2. The system of claim 1, wherein each of said first signal line is a point-to-point electrical connection for transferring said enable signal, wherein said enable signal is a maintenance enable signal.

3. The system of claim 1, wherein each of said second signal line is a point-to-point electrical connection for transferring said test result signal, wherein said test result signal is a TAP control bus receive data signal.

4. The system of claim 1, wherein said controller further comprises:

a processor, for producing said test access port signals and enable signals;

a latch coupled to said processor for receiving and storing logic states of said enable signals; and a multiplexer coupled to said processor and said latch, wherein said multiplexer selects a particular test result signal and passes said selected signal to said processor, based on corresponding logic states stored in said latch that are active.

5. The system of claim 1, wherein the system logic board further comprises an interface enable circuit coupled to said bus, said first signal line and said second signal line, wherein said interface enable circuit passes said test access port signals to at least one integrated circuit on the system logic board when said enable signal is active causing the system logic board to produce test result signals.

6. A system for testing and controlling a plurality of system logic boards, each system logic board having at least one integrated circuit which is designed in accordance with conventional test access port and boundary-scan architecture standards, the system, comprising:

a first controller for producing test access port signals and enable signals;

a second controller for producing test access port signals and enable signals;

a first bus coupled between said first controller and the plurality of system logic boards for transferring said test access port signals from said first controller to the plurality of system logic boards;

a second bus coupled between said second controller and the plurality of system logic boards for transferring said test access port signals from said second controller to the plurality of system logic boards;

first signal lines coupled between said first controller and the plurality of system logic boards, for transferring at least one active or non-active enable signal from said first controller to at least one of the plurality of system logic boards;

second signal lines coupled between said second controller and the plurality of system logic boards, for transferring at least one active or non-active enable signal from said second controller to at least one of the plurality of system logic boards, wherein said system logic boards are responsive to said test access port signals from at most only one of said busses based on a predefined combination of said active or non-active enable signals from said first controller and said second controller and cause said system logic boards to produce test result signals;

third signal lines coupled between said first controller and the plurality of system logic boards, for transferring said test result signals to said first controller; and fourth signal lines coupled between said second controller and the plurality of system logic boards, for transferring said test result signals to said second controller.

7. The system of claim 6, wherein each of said first signal line and said second signal line is a point-to-point electrical connection for transferring said enable signal, wherein said enable signal is a maintenance enable signal.

8. The system of claim 6, wherein each of said third signal line and said fourth signal line is a point-to-point electrical connection for transferring said test result signal, wherein said test result signal is a TAP control bus receive data signal.

9. The system of claim 6, wherein each of said first controller and second controller further comprises:

a processor, for producing said test access port signals and enable signals;

a latch coupled to said processor for receiving and storing logic states of said enable signals; and a multiplexer coupled to said processor and said latch, wherein said multiplexer selects a particular test result signal and passes said selected signal to said processor, based on corresponding logic states stored in said latch that are active.

10. The system of claim 6, wherein the system logic board further comprises an interface enable circuit coupled to said first bus, said second bus, said first signal line, said second signal line, said third signal line and said fourth signal line, wherein said interface enable circuit passes said test access port signals from at most only one of said busses to at least one integrated circuit on the system logic board based on said predefined combination of enable signals, causing the system logic board to produce test result signals.

11. The system of claim 10, wherein said interface enable circuit further comprises:

a first set of interface pins; and a second set of interface pins, wherein said first bus and said second bus are interchangeably coupled to said first set of interface pins or second set of interface pins.

12. A method for testing and controlling a plurality of system logic boards with a controller, each system logic board having at least one integrated circuit which is designed in accordance with conventional test access port and boundary-scan architecture standards, comprising the step of:

(a) transferring at least one active or non-active enable signal to at least one of the plurality of system logic boards;

(b) enabling at least one target system logic board with said active enable signal;

(c) sending test access port signals from the controller to all system logic boards simultaneously, wherein said test access port signals include a test data input signal (TC_TXD); and (d) transferring a test result signal from said enabled target system logic board to said controller.

13. A method as recited in claim 12, wherein said enabling step includes the step of enabling an interface enable circuit that passes said test access port signals to said integrated circuit and passes result data from said integrated circuit to said controller.

14. A method as recited in claim 12, further comprising the step of writing bit values to an enable register.

* * * * *